United States Patent
Sakaguchi

(10) Patent No.: US 8,878,561 B2
(45) Date of Patent: Nov. 4, 2014

(54) SCREENING METHOD, SCREENING DEVICE AND PROGRAM

(75) Inventor: Kazuhiro Sakaguchi, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 193 days.

(21) Appl. No.: 13/558,980

(22) Filed: Jul. 26, 2012

(65) Prior Publication Data

US 2013/0057311 A1   Mar. 7, 2013

(30) Foreign Application Priority Data

Feb. 1, 2001  (JP) ................. 2011-190262

(51) Int. Cl.
*G01R 31/00* (2006.01)
*H01L 21/66* (2006.01)
*G01R 31/28* (2006.01)
*G01R 31/317* (2006.01)

(52) U.S. Cl.
CPC ............ *G01R 31/2894* (2013.01); *H01L 22/14* (2013.01); *H01L 22/20* (2013.01); *G01R 31/31718* (2013.01)
USPC ............ 324/759.03; 324/757.04; 324/759.01; 324/522; 324/512; 702/117; 702/118; 702/122; 702/123; 702/124; 438/14; 438/15; 438/16; 438/17; 257/E21.525

(58) Field of Classification Search
USPC ............. 324/757.03, 757.04, 759.01–759.03, 324/72.05, 500, 512, 522; 702/117–124, 702/182, 183, 84, 35; 438/14–17; 257/E21.525
See application file for complete search history.

(56) References Cited

U.S. PATENT DOCUMENTS

| | | | | |
|---|---|---|---|---|
| 6,665,623 | B1* | 12/2003 | Pasadyn et al. | 702/84 |
| 6,787,379 | B1* | 9/2004 | Madge et al. | 438/17 |
| 7,062,415 | B2* | 6/2006 | Whitefield et al. | 702/194 |
| 7,617,427 | B2* | 11/2009 | Haehn et al. | 714/724 |
| 7,991,574 | B2* | 8/2011 | Gattiker | 702/118 |
| 8,190,391 | B2* | 5/2012 | Kadosh et al. | 702/118 |
| 8,417,477 | B2* | 4/2013 | Miguelanez et al. | 702/118 |
| 8,440,474 | B2* | 5/2013 | Yanai | 438/14 |
| 2001/0053962 | A1* | 12/2001 | Yoshida et al. | 702/123 |
| 2009/0000995 | A1* | 1/2009 | Yanai | 209/557 |
| 2009/0297019 | A1* | 12/2009 | Zafar et al. | 382/145 |
| 2011/0071782 | A1* | 3/2011 | Nahar et al. | 702/82 |

FOREIGN PATENT DOCUMENTS

JP   2007-123623   5/2007
JP   2008-002900   1/2008

* cited by examiner

*Primary Examiner* — Tung X Nguyen
*Assistant Examiner* — Thang Le
(74) *Attorney, Agent, or Firm* — Young & Thompson

(57) ABSTRACT

This invention is to detect defective products of semiconductor devices with high accuracy even when the characteristics of the semiconductor devices vary according to their positions on each of wafers. A screening method includes the steps of measuring respective electrical characteristic values of a plurality of semiconductor devices included in a wafer; acquiring respective positional information of the semiconductor devices over the wafer; subtracting components relatively gently varying over the surface of the wafer, of variations in the electrical characteristic values of the semiconductor devices from the respective electrical characteristic values of the semiconductor devices to thereby correct the respective electrical characteristic values of the semiconductor devices; generating distributions of the post-correction electrical characteristic values with respect to the semiconductor devices; and detecting semiconductor devices in which the post-correction electrical characteristic values assume outliers, out of the semiconductor devices, based on the distributions.

13 Claims, 12 Drawing Sheets

SCREENING METHOD, SCREENING DEVICE AND PROGRAM

CROSS-REFERENCE TO RELATED APPLICATIONS

The disclosure of Japanese Patent Application No. 2011-190262 filed on Sep. 1, 2011 including the specification, drawings and abstract is incorporated herein by reference in its entirety.

BACKGROUND

The present invention relates to a screening method, a screening device and a program, and particularly to a screening method, a screening device and a program which respectively measure the characteristics of semiconductor devices and detect outliers in the characteristics to thereby screen the semiconductor devices.

A screening device suitable for semiconductor devices is used to detect defects inherent in the semiconductor devices and screen the semiconductor devices. A screening device described in, for example, a Patent Document 1 observes physical quantities of semiconductor devices on a wafer, inspects distributions of the physical quantities to identify semiconductor devices indicative of physical quantities (i.e., outliers or abnormal values) that deviate from the distributions, thereby performing their screening. Such a technique is also called outlier screening.

FIG. 12 is a block diagram showing a configuration of the screening device described in the Patent Document 1. Semiconductor devices fabricated over each wafer 4 are electrically coupled to an LSI tester 1 through a prober 2. Thus, various physical quantities of the semiconductor devices are measured. The measured physical quantities are stored in a data file 3 along with information for identifying the semiconductor devices. A computer 5 calculates respective distributions of the measure physical quantities and identifies semiconductor devices indicating physical quantities that deviate from the distributions respectively.

There has been described in a Patent Document 2, a semiconductor testing method which selects a semiconductor chip determined to be a non-defective product as a target for determination, defines a calculation range of predetermined sizes around the selected semiconductor chip, generates an electrical characteristic distribution in the calculation range using the electrical characteristics of each semiconductor chip determined to be a non-defective product, of semiconductor chips included in the calculation range, and determines whether the selected semiconductor chip falls outside the prescription in the electrical characteristic distribution.

RELATED ART DOCUMENTS

Patent Documents

[Patent Document 1] Japanese Patent Laid-Open No. 2008-002900
[Patent Document 2] Japanese Patent Laid-Open No. 2007-123623

SUMMARY

The following analyses have been made by the present inventors.

In the method described in the Patent Document 1, variations in physical quantity based on defective factors inherent in semiconductor devices are detected as outliers from distributions of the physical quantities relative to all semiconductor devices provided over a wafer. The physical quantities indicative of the characteristics of the semiconductor devices do not necessarily vary based on only defective factors.

It has been known that the physical quantities indicative of the characteristics of semiconductor devices manufactured over a wafer vary according to their positions placed over the wafer. Such variations in physical quantity arise from the fact that the conditions for the manufacture of semiconductor devices by a semiconductor manufacturing apparatus are ununiform over the wafer. When a variation in the physical quantity due to a defective factor to be detected is canceled out by a variation in the physical quantity due to the position, a semiconductor device to be detected as a defective product is likely to be determined as a non-defective product. Since the variation in the physical quantity due to the position serves as to expand the width of a distribution of physical quantities, it becomes difficult to detect the variation in the physical quantity due to the defective factor as an outlier (abnormal value).

According to the semiconductor testing method described in the Patent Document 2, there is a problem in that the average value of the electrical characteristics and their distribution vary every defined calculation range, thereby encountering a difficulty in appropriately setting the outlier (abnormal value).

An object of the present invention is to provide a screening method, a screening device and a program capable of detecting defective products of semiconductor devices with high accuracy even when the characteristics of the semiconductor devices vary according to their positions on each of wafers.

A screening method according to a first aspect of the present invention includes the steps of measuring respective electrical characteristic values of a plurality of semiconductor devices included in a wafer; acquiring positional information of the semiconductor devices over the wafer; subtracting components relatively gently varying over the surface of the wafer, of variations in the electrical characteristic values of the semiconductor devices from the respective electrical characteristic values of the semiconductor devices to thereby correct the respective electrical characteristic values of the semiconductor devices; generating distributions of the post-correction electrical characteristic values with respect to the semiconductor devices; and detecting semiconductor devices in which the post-correction electrical characteristic values assume outliers, out of the semiconductor devices, based on the distributions.

A screening device according to a second aspect of the present invention is equipped with a corrector which inputs therein respective electrical characteristic values of a plurality of semiconductor devices included in a wafer and respective positional information of the semiconductor devices over the wafer, and subtracts components relatively gently varying over the surface of the wafer, of variations in the electrical characteristic values of the semiconductor devices from the respective electrical characteristic values of the semiconductor devices to thereby correct the respective electrical characteristic values of the semiconductor devices; a distribution generator which generates distributions of the post-correction electrical characteristic values with respect to the semiconductor devices; and an outlier detector which detects semiconductor devices in which the post-correction electrical characteristic values assume outliers, out of the semiconductor devices, based on the distributions.

A program according to a third aspect of the present invention causes a computer to execute a process for acquiring respective electrical characteristic values of a plurality of semiconductor devices included in a wafer and respective positional information of the semiconductor devices over the wafer; a process for subtracting components relatively gently varying over the surface of the wafer, of variations in the electrical characteristic values of the semiconductor devices from the respective electrical characteristic values of the semiconductor devices to thereby correct the respective electrical characteristic values of the semiconductor devices; a process for generating distributions of the post-correction electrical characteristic values with respect to the semiconductor devices; and a process for detecting semiconductor devices in which the post-correction electrical characteristic values assume outliers, out of the semiconductor devices, based on the distributions.

According to the screening method, screening device and program according to the present invention, defective products of semiconductor devices can be detected with high accuracy even when the characteristics of semiconductor devices vary according to their positions over a wafer.

DETAILED DESCRIPTION

Figure 1:
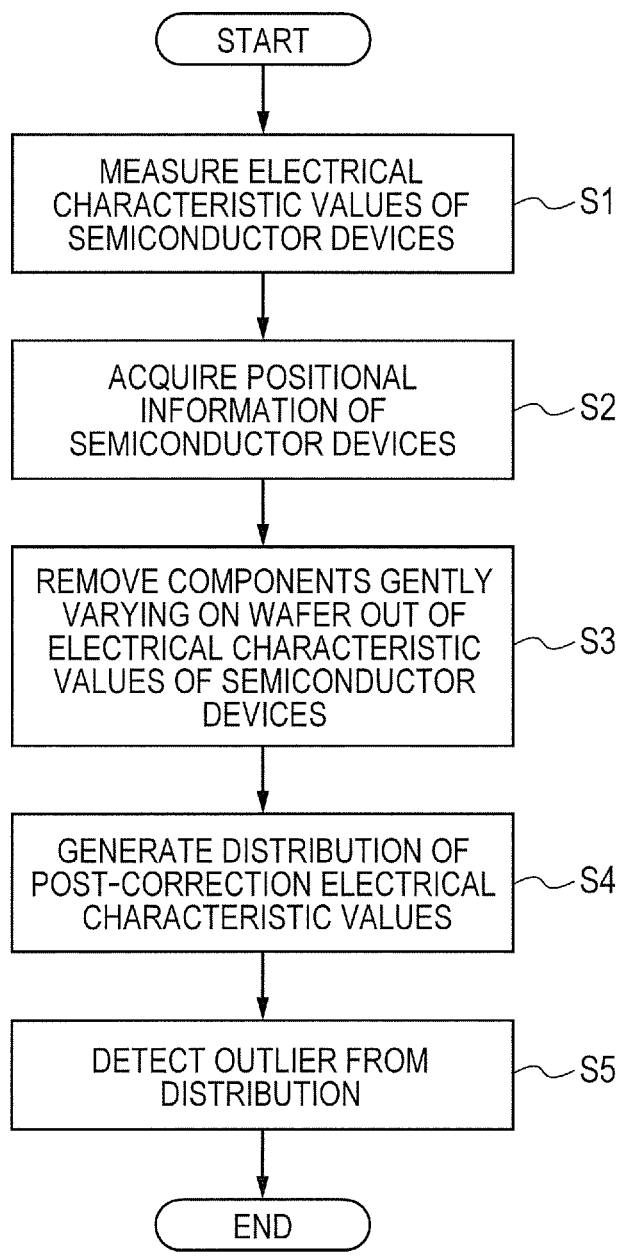
FIG. 1 is a flowchart showing an outline of a screening method according to the present invention as one example.

A summary of the present invention will first be explained. Incidentally, reference numerals in the accompanying drawings given to the summary are illustrated for the purpose of helping understanding only, and are not intended to limit the present invention to illustrated embodiments.

Referring to FIG. 1, a screening method according to the present invention includes a step (Step S1) for measuring respective electrical characteristic values of a plurality of semiconductor devices included in a wafer, a step (Step S2) for acquiring respective positional information of the semiconductor devices over the wafer, a step (Step S3) for subtracting components relatively gently varying over the wafer, of variations in the electrical characteristic values of the semiconductor devices from the respective electrical characteristic values of the semiconductor devices to thereby correct the respective electrical characteristic values of the semiconductor devices, a step (Step S4) for generating distributions of the post-correction electrical characteristic values with respect to the semiconductor devices, and a step (Step S5) for detecting a semiconductor device in which the post-correction electrical characteristic value assumes an outlier, from within the semiconductor devices.

Figure 2:
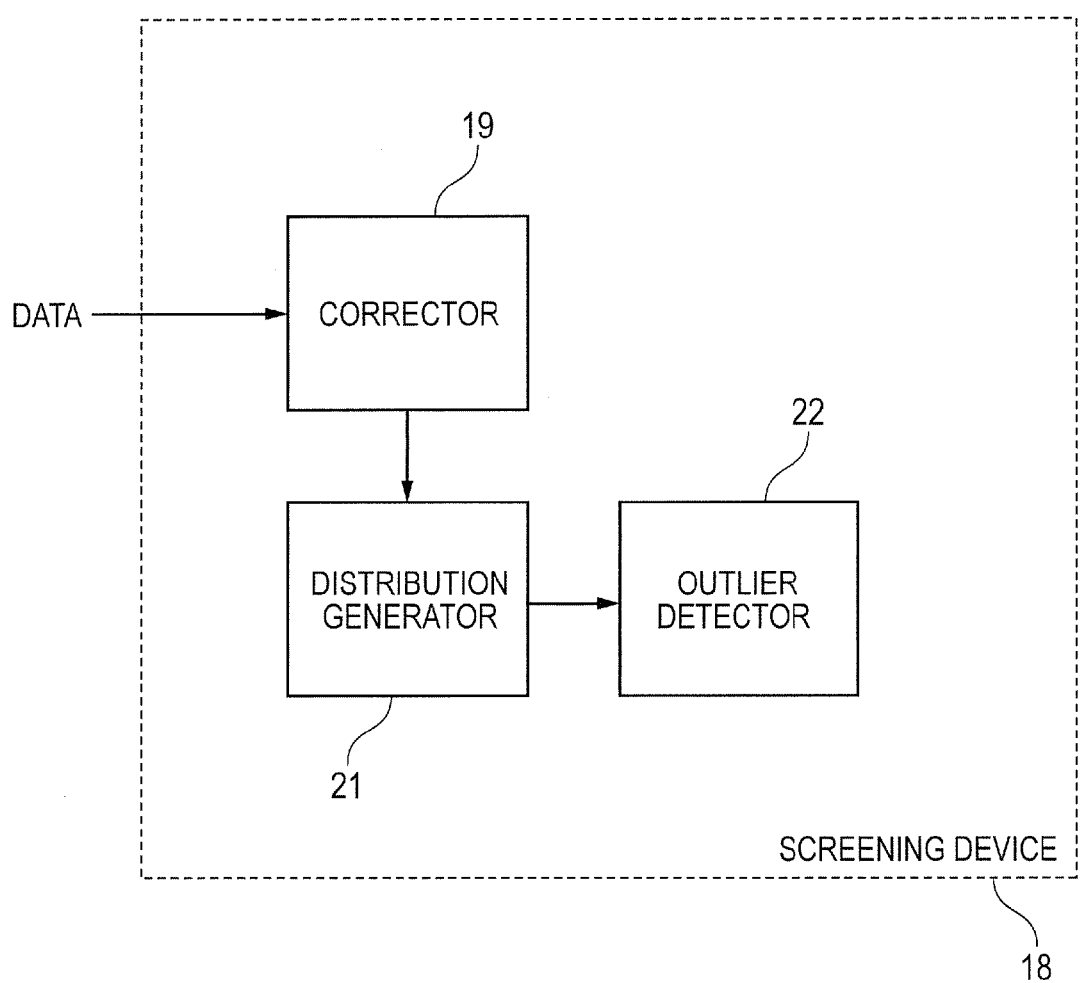
FIG. 2 is a block diagram illustrating a schematic configuration of a screening device according to the present invention as one example.

Referring to FIG. 2, a screening device (18) according to the present invention includes a corrector (19) which inputs therein respective electrical characteristic values of a plurality of semiconductor devices included in a wafer and respective positional information of the semiconductor devices over the wafer and which subtracts components relatively gently varying over the surface of the wafer, of variations in the electrical characteristic values of the semiconductor devices from the respective electrical characteristic values of the semiconductor devices to thereby correct the respective electrical characteristic values of the semiconductor devices, a distribution generator (21) which generates distributions of the post-correction electrical characteristic values with respect to the semiconductor devices, and an outlier detector (22) which detects semiconductor devices in which the post-correction electrical characteristic values assume outliers, out of the semiconductor devices based on the distributions.

The respective steps from Steps S3 through S5 in the screening method (FIG. 1) according to the present invention, and processing at the respective parts (19, 21 and 22) of the screening device (FIG. 2) according to the present invention are implemented as modules of a computer-readable program, and further a computer may be allowed to execute such a program.

The screening device, screening method and program according to the present invention eliminate or minimizes variable components of physical quantities based on the on-wafer positions of semiconductor devices fabricated over the wafer from physical quantity information (e.g., current, voltage and frequency values, etc. being electrical characteristics measurable by a tester) indicative of the characteristics of the semiconductor device to thereby improve the accuracy of detection of physical quantity variations indicative of the characteristics of the semiconductor device due to the inherence of defective factors.

Figure 4:
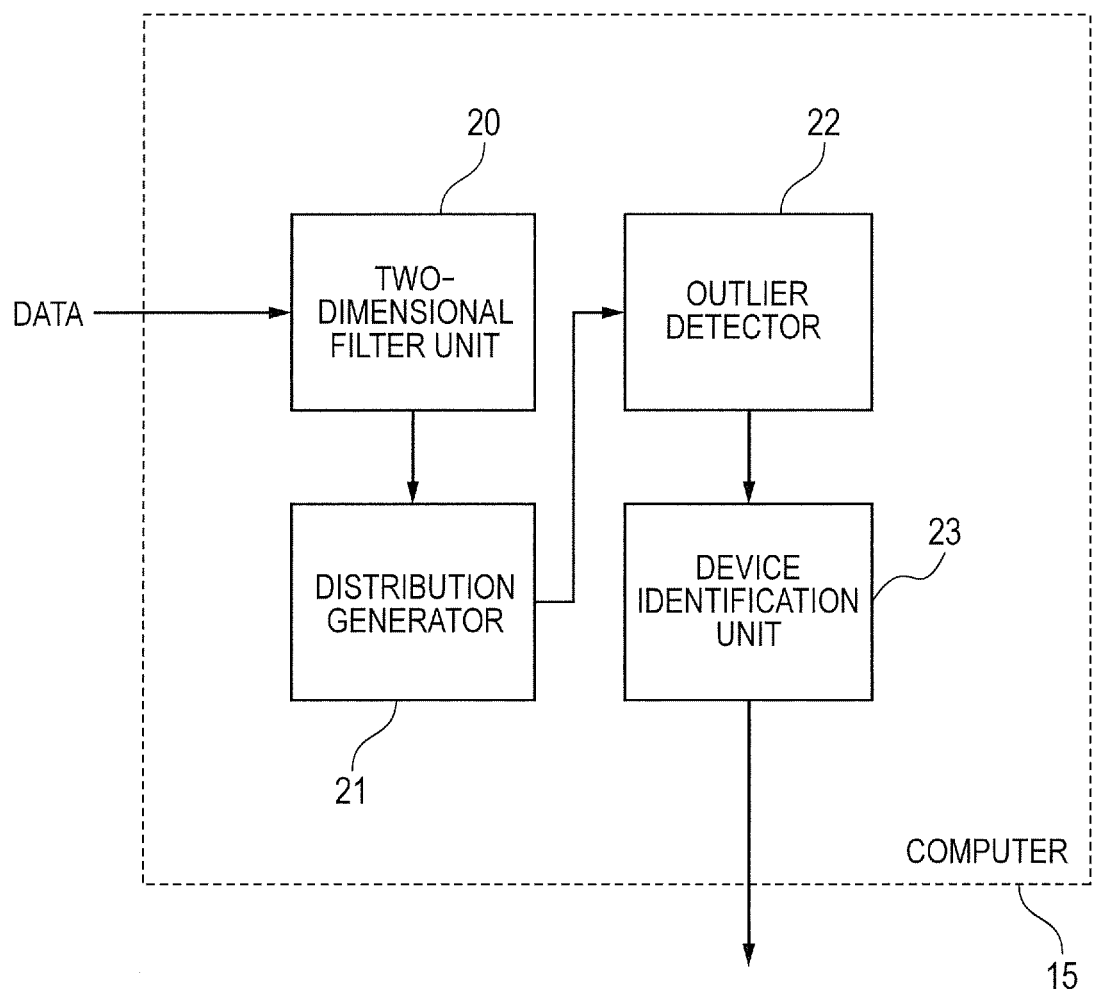
FIG. 4 is a block diagram snowing a configuration of a computer employed in the screening device according to the first embodiment as one example.

Referring to FIG. 4, a computer 15 corresponding to the screening device may have a two-dimensional filter unit (20) which performs a low-frequency cut in spatial frequency of each physical quantity in order to eliminate variable components each corresponding to the on-wafer position of each semiconductor device, of the physical quantities indicative of the characteristics of each semiconductor device over the wafer. The screening method may include a step for performing two-dimensional filtering, especially, a low-frequency cut in spatial frequency on the physical quantity defined corresponding to the position of each semiconductor device over the wafer. Further, the program may allow a computer to execute a process for executing two-dimensional filtering, especially, a low-frequency cut in spatial frequency on the physical quantity of the semiconductor device over the wafer, based on its positional information.

Figure 5:
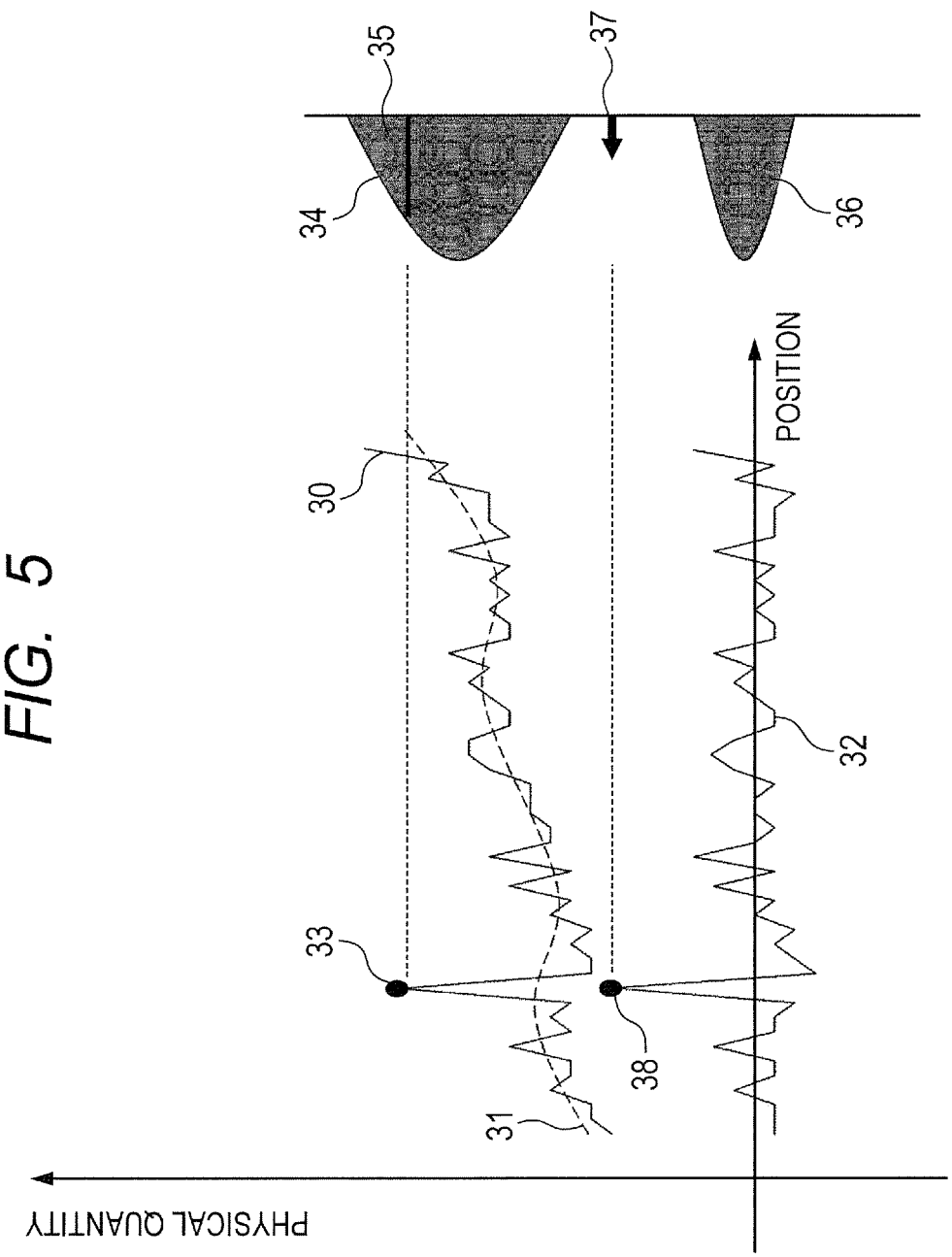
FIG. 5 is a diagram for describing the operation and effects of the screening device according to the first embodiment.

FIG. 5 is a diagram for describing the operations and effects of the screening device, screening method and program according to the present invention. A graph 30 (solid line) indicates the relationship between physical quantities indicative of the characteristics of each semiconductor device and the position thereof over a wafer. The vertical axis of FIG.

5 indicates the physical quantity, and the horizontal axis thereof indicates the position. The position of the horizontal axis indicates, for example, a position on a straight line that cuts across the wafer in an appropriate direction. Referring to FIG. 5, the physical quantity varies gently according to the position. That is, a variation in physical quantity includes a component dependent on each position, and a component based on a variable factor other than it. A graph 31 (broken line) indicates a component that depends on each position. On the other hand, a graph 32 indicates a component that does not depend on each position. Incidentally, although the graphs 30 through 32 are respectively represented by continuous curves, these curves are curves obtained by connecting points indicative of physical quantities of each semiconductor device, each point being associated with a discrete position (e.g., the center of the semiconductor device being taken as such a position) of each semiconductor device, to each other by line segments.

As the features of the semiconductor devices, there are mentioned features that the characteristics of the semiconductor devices close to each other over the wafer assume values approximate to each other. As shown in the graph 31 of FIG. 5, a variation in physical quantity dependent on each position is a gentle continuous variation. On the other hand, as shown in the graph 32 of FIG. 5, a variation in physical quantity non-dependent on each position results in a variation that is sharp and discontinuous.

In view of the spatial frequency, the variation in the physical quantity dependent on the position of each semiconductor device exists in a relatively low frequency domain. On the other hand, the variation in the physical quantity non-dependent on the position thereof exists in a relatively high frequency domain. Thus, assuming that the observed physical quantities indicative of the characteristics of each semiconductor device are taken as a function of its position over the wafer, the physical quantities can be separated into a component (component on the low-frequency side) dependent on the position and a component (component on the high-frequency side) non-dependent on the position.

In the screening device described in the Patent Document 1, the physical quantities indicative of the characteristics of each semiconductor device are used as they are to create or generate a distribution map. The semiconductor device indicating the physical quantities deviated from the distribution map is identified. As described above, however, the physical quantities indicative of the characteristics of the semiconductor device include the component dependent on its position over the wafer and the component non-dependent on the position. A variation in the physical quantity due to the existence of a defective factor is included in the component non-dependent on the position. When the magnitude of the position-dependent component of physical quantity becomes large, the variation in the physical quantity due to the defective factor, which is included in the position-nondependent component, is screened or blocked off and thereby becomes difficult to detect.

Referring to FIG. 5, a distribution 34 indicates a distribution of physical quantities indicative of the characteristics of each semiconductor device. A physical quantity 33 indicates a physical quantity measured with respect to a semiconductor device having a defective factor. The distribution 34 indicates a distribution obtained by adding together variations each dependent on the position and variations each non-dependent on the position, of the physical quantities indicative of the characteristics of each semiconductor device. A physical quantity 35 indicates the position of the physical quantity 33 relative to the distribution 34. At this time, a variation in the physical quantity due to the defective factor is screened by a position-dependent variable component and hence the physical quantity 33 becomes difficult to detect as an outlier from the distribution 34.

On the other hand, a distribution 36 indicates a physical quantity corrected by removing a position-dependent component 31 from an observed physical quantity 30 indicative of the characteristics of the semiconductor device, i.e., a distribution of a position-nondependent component 32. The distribution 36 becomes narrower in width than the distribution 34. A physical quantity 37 indicates the position of the post-correction physical quantity 38 of the semiconductor device having the defective factor with respect to the distribution 36. At this time, it is possible to easily detect the physical quantity 38 as an outlier.

As described above, it has been known that as the features of the semiconductor devices, the characteristic values of the semiconductor devices close to one another over the wafer respectively assume values extremely approximate to one another. Thus, assuming that the physical quantities indicative of the characteristics of the semiconductor devices are taken as a function of their positions over the wafer, the function gently changes as indicated by the variable value 31. This function exists in a relatively low frequency domain in terms of the spatial frequency. On the other hand, the variation in the physical quantity nondependent on the position of each semiconductor device is random as represented by the graph 32. Assuming that the graph 32 is taken as the function of the position of each semiconductor device, the graph 32 exists in a relatively high frequency domain in terms of the spatial frequency. Assuming that the variation 30 in the physical quantity indicative of the characteristics of each semiconductor device is taken as the function of the position of each semiconductor device in view of the features of both functions, only a position-nondependent variation in physical quantity can be taken out by performing the operation of cutting a lower frequency in terms of the spatial frequency.

Thus, in order to eliminate the component (low-frequency component) gently varying over the wafer, of the characteristics of the semiconductor device, the screening device (18) shown in FIG. 1 is provided with the corrector (19), and the computer (15) shown in FIG. 4 is provided with the two-dimensional filter unit (20). The screening method of the present invention has a step for cutting a low frequency by a two-dimensional filter to cut the low frequency in terms of the spatial frequency. Further, the program of the present invention allows the computer to execute the process of cutting the low frequency by the two-dimensional filter in terms of the spatial frequency.

First Embodiment

Figure 3:
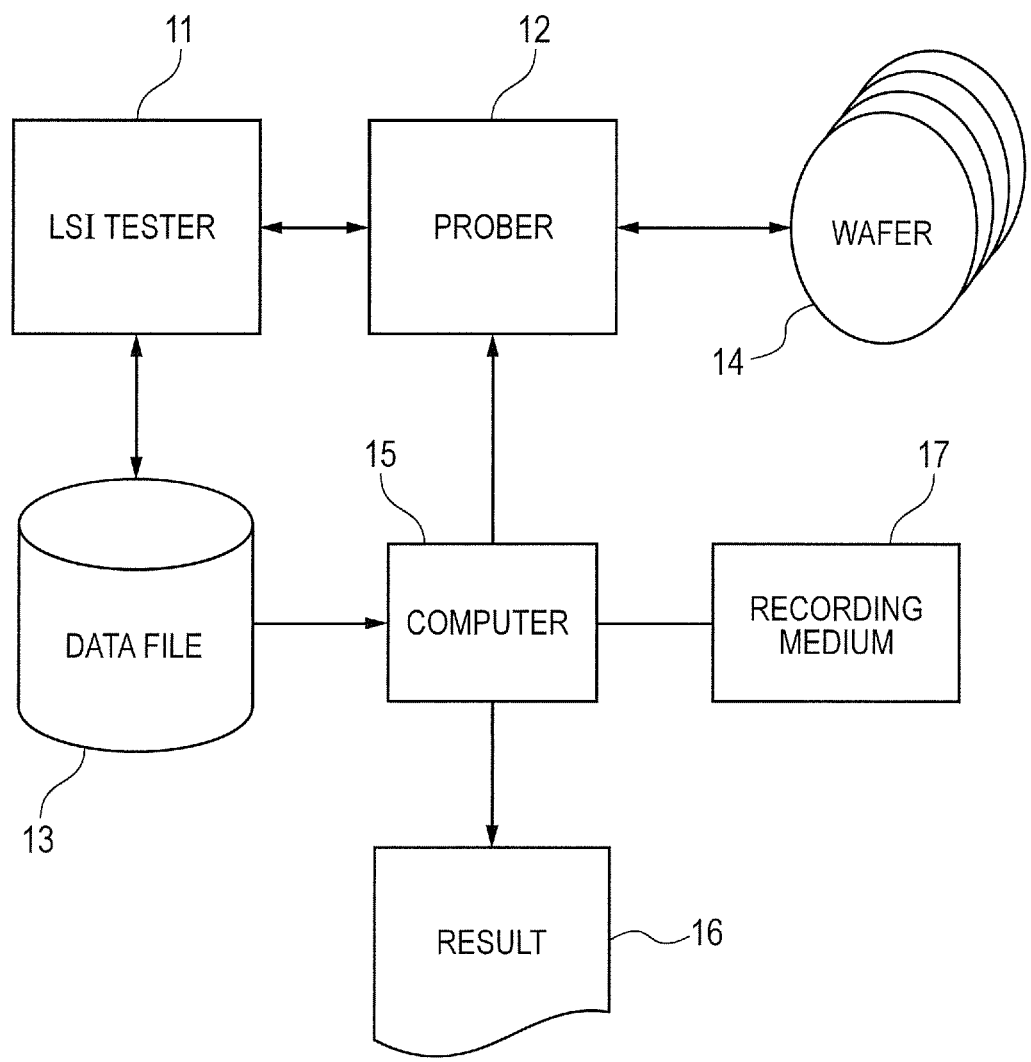
FIG. 3 is a block diagram depicting a configuration of a screening device according to a first embodiment as one example.

A screening device according to a first embodiment will be explained with reference to the accompanying drawings. FIG. 3 is a block diagram showing as one example, a configuration of a screening system including the screening device according to the present embodiment as a computer 15. Referring to FIG. 3, the screening system is equipped with an LSI tester 11, a prober 12, a data file 13 and a recording medium 17 in addition to the computer 15. A wafer 14 provided with semiconductor devices each target for measurement, and a result 16 outputted from the computer 15 are also shown together in FIG. 3.

Each of the semiconductor devices is fabricated over the wafer 14. The semiconductor device is electrically coupled to the LSI tester 11 through the prober 12. The prober 12 is coupled to the computer 15. The computer 15 controls the prober 12 in accordance with a prescribed procedure. The prober 12 transmits positional information of each semiconductor device placed over the wafer 14 to the LSI tester 11 or the computer 15. The LSI tester 11 observes the characteristics of each semiconductor device over the wafer 14 in accordance with the a prescribed procedure and outputs the result of observation including the observed physical quantities (e.g., current value, voltage value, frequency, etc.), GO/NOGO of the semiconductor device based on the result of observation, and positional information of the semiconductor device to be measured over the wafer 14 to the data file 13. Incidentally, although not defined in FIG. 3, the computer 15 may control the operation of the LSI tester 11.

The computer 15 is coupled to the data file 13. The computer 15 reads the observed physical-quantity information of the semiconductor device and the positional information thereof from the data file 13, calculates positional information of a semiconductor device having a physical quantity taken as an outlier in accordance with a prescribed procedure and outputs the same to the result 16.

Incidentally, a series of operations may be recorded in the recording medium 17 coupled to the computer 15 as a computer program for controlling the entire part.

FIG. 4 is a block diagram showing as one example, a configuration of the computer 15 in the screening device according to the present embodiment. Referring to FIG. 4, the computer 15 is equipped with a two-dimensional filter unit 20, a distribution generator 21, an outlier detector 22 and a device identification unit 23.

The two-dimensional filter unit 20 receives data sent from the data file 13. The data includes physical quantity information and positional information observed with respect to each semiconductor device. Incidentally, the data is limited to that related to a GO-judged semiconductor device. The two-dimensional filter unit 20 determines a physical quantity as a function of position placed over the wafer, performs a low-frequency cut operation on a spatial frequency and calculates a corrected physical quantity. The two-dimensional filter unit 20 transmits information about the corrected physical quantity to the distribution generator 21.

The distribution generator 21 generates a distribution map of the post-correction physical-quantity information. At this time, a prescribed population or parent set of semiconductor devices existing over the same wafer, or semiconductor devices or the like of the same lot is defined as a population for generating the distribution map. The distribution generator 21 transmits information about the generated distribution map to the outlier detector 22.

The outlier detector 22 analyses the distribution map in accordance with a predetermined procedure and standard values to perform a GO/NOGO judgement. The outlier detector 22 determines, for example, the average value in the distribution map and its standard deviation and detects a value that falls below or beyond a predetermined Z value, as an outlier. The outlier detector 22 transmits the result of GO/NOGO judgement to the device identification unit 23.

The device identification unit 23 identifies positional information of a semiconductor device indicative of an outlier, based on the received result of GO/NOGO judgement and outputs the identified positional information therefrom.

Figure 6:
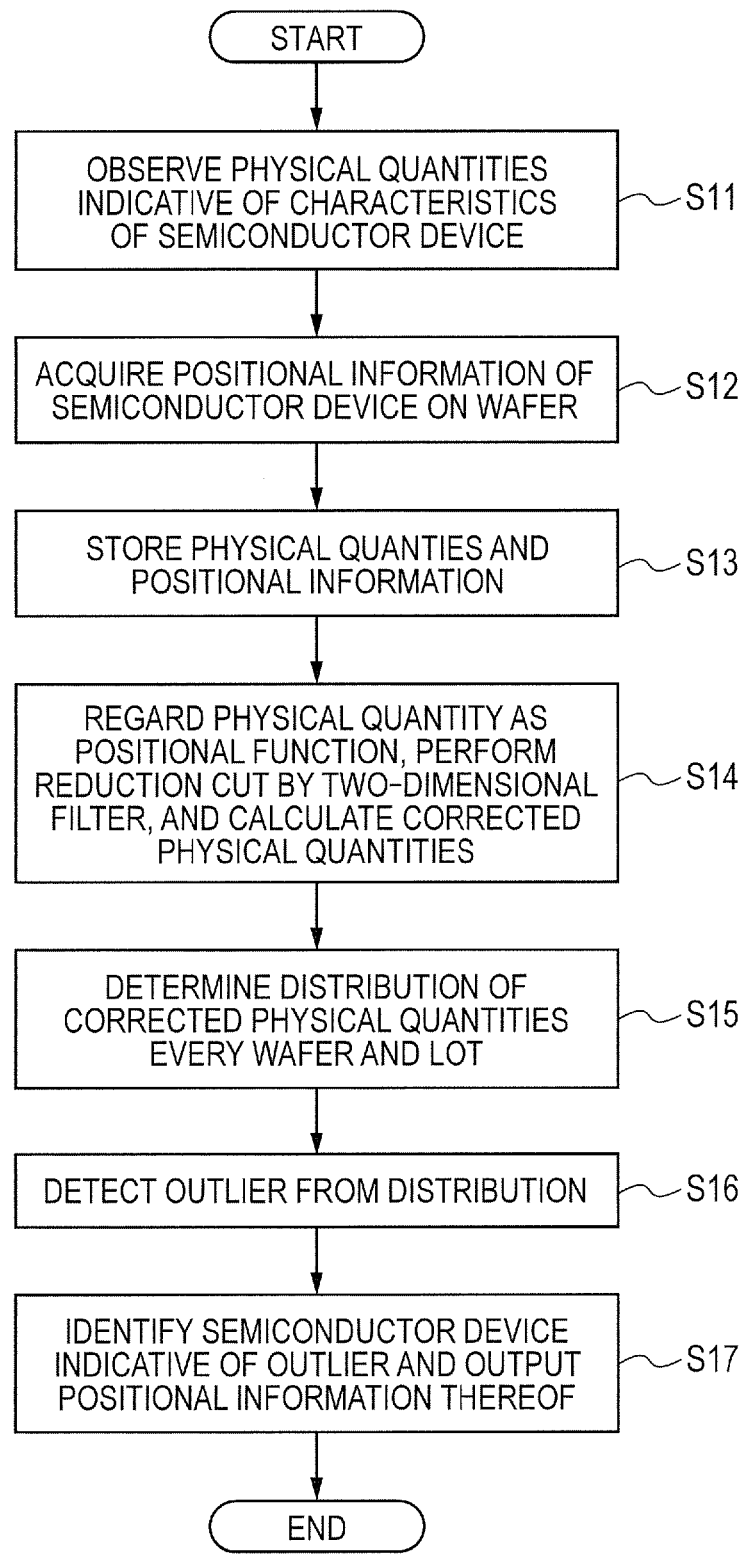
FIG. 6 is a flowchart showing the operation of the screening device according to the first embodiment as one example.

FIG. 6 is a flowchart showing as one example, the operation of the screening device (computer) 15 according to the present embodiment shown in FIGS. 3 and 4. The operation of the screening device according to the present embodiment will be explained with reference to FIG. 6.

Each of semiconductor devices that are devices to be measured is fabricated over the wafer 14. The semiconductor device is electrically coupled to the LSI tester 11 through the prober 12. The LSI tester 11 performs the supply of power to the semiconductor device, the application of signals thereto and the measurement of electrical characteristics thereof. The prober 12 configures a coupling between the semiconductor devices placed over the wafer 14 and the LSI tester 11 in accordance with a prescribed procedure and enables observations of the semiconductor devices by means of the LSI tester 11. These series of operations may be performed in accordance with instructions given by the computer 15.

The LSI tester 11 supplies power and electric signals to the coupled semiconductor devices in accordance with a prescribed procedure and measures various physical quantities (such as a voltage value, a current value, a frequency, etc.) (Step S11). The LSI tester 11 judges GO or NOGO as to each semiconductor device, based on a predetermined method and standard values.

The prober 12 transmits positional information about each semiconductor devices placed over the wafer 14 to the LSI tester 11 (Step S12). The LSI tester 11 stores the results of observation such as the physical quantities, the GO/NOGO results and so on in the data file 13 together with the positional information of the semiconductor devices placed over the wafer 14.

The data file 13 stores therein the physical quantities corresponding to the observed values of the semiconductor devices in matching with the positional information of the semiconductor devices and the GO/NOGO results of the semiconductor devices (Step S13). After a series of observations of the semiconductor devices placed over the wafer 14 have all been completed, the physical quantities corresponding to the observed values, and the positional information both stored in the data file 13 are transmitted to the computer 15. The transmitted physical quantities and positional information are however only those related to the GO-judged semiconductor devices. Incidentally, in regard to semiconductor devices each NOGO-judged as to at least any of a plurality of physical quantities to be noted, the physical quantity and positional information may be excluded from each target to be transmitted to the computer 15.

In the computer 15, the two-dimensional filter unit 20 assumes the physical quantity information sent from the data file 13 to be a positional function and performs a low-frequency cut process in terms of the spatial frequency (Step S14). A prescribed appropriate value is used as a two-dimensional filter characteristic. For example, lower limit values fx and fy of a spatial frequency in each of two directions orthogonal to each other within a wafer surface are defined. Components lower in spatial frequency than fx and fx, of variable components of physical quantities may be removed by filtering.

The distribution generator 21 determines a distribution of the corrected physical quantities obtained by the two-dimensional filter unit (Step S15). A prescribed population or parent set of semiconductor devices existing over a single wafer, or semiconductor devices or the like over a wafer, of all or some included in a single lot can be used as a distribution's population.

The outlier detector 22 specifies a post-correction physical quantity taken as an outlier by a prescribed method from the distribution generated by the distribution generator 21 (Step S16).

The device identification unit 23 identifies the positional information matched with the physical quantity taken as the outlier and outputs it to the result 16 (Step S17).

The screening device according to the present embodiment removes the components of the characteristics of the semiconductor devices, which gently vary depending on the positions of the semiconductor devices placed over the wafer. Thus, according to the screening device of the present embodiment, defective products of semiconductor devices can be detected with high accuracy even where the characteristics of the semiconductor devices vary according to the positions thereof placed over the wafer.

Second Embodiment

Figure 7:
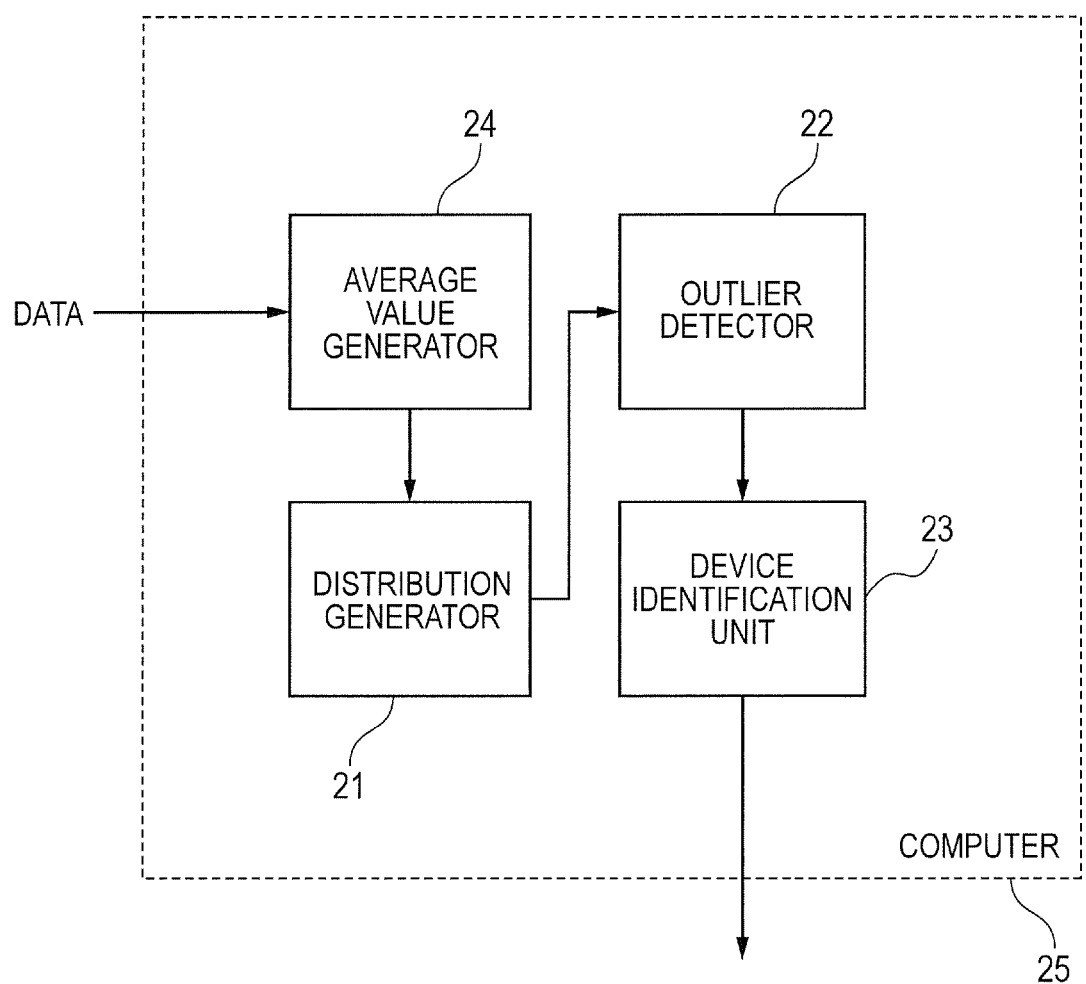
FIG. 7 is a block diagram illustrating a configuration of a computer employed in a screening device according to a second embodiment as one example.

A screening device according to a second embodiment will be explained with reference to the accompanying drawings. FIG. 7 is a block diagram showing as one example, a configuration of a computer 25 equivalent to the screening device according to the present embodiment. Referring to FIG. 7, the computer 25 is equipped with an average value generator 24, a distribution generator 21, an outlier detector 22 and a device identification unit 23. The computer 25 of the present embodiment is equipped with the average value generator 24 instead of the two-dimensional filter unit 20 of the computer 15 (FIG. 4) in the first embodiment.

The average value generator 24 calculates an average value of physical quantities of peripheral semiconductor devices including a target semiconductor device in regard to the physical quantities indicative of the characteristics of the semiconductor devices and outputs a value obtained by subtracting the average value from the physical quantity of the target semiconductor device, as a corrected physical quantity.

Figure 8:
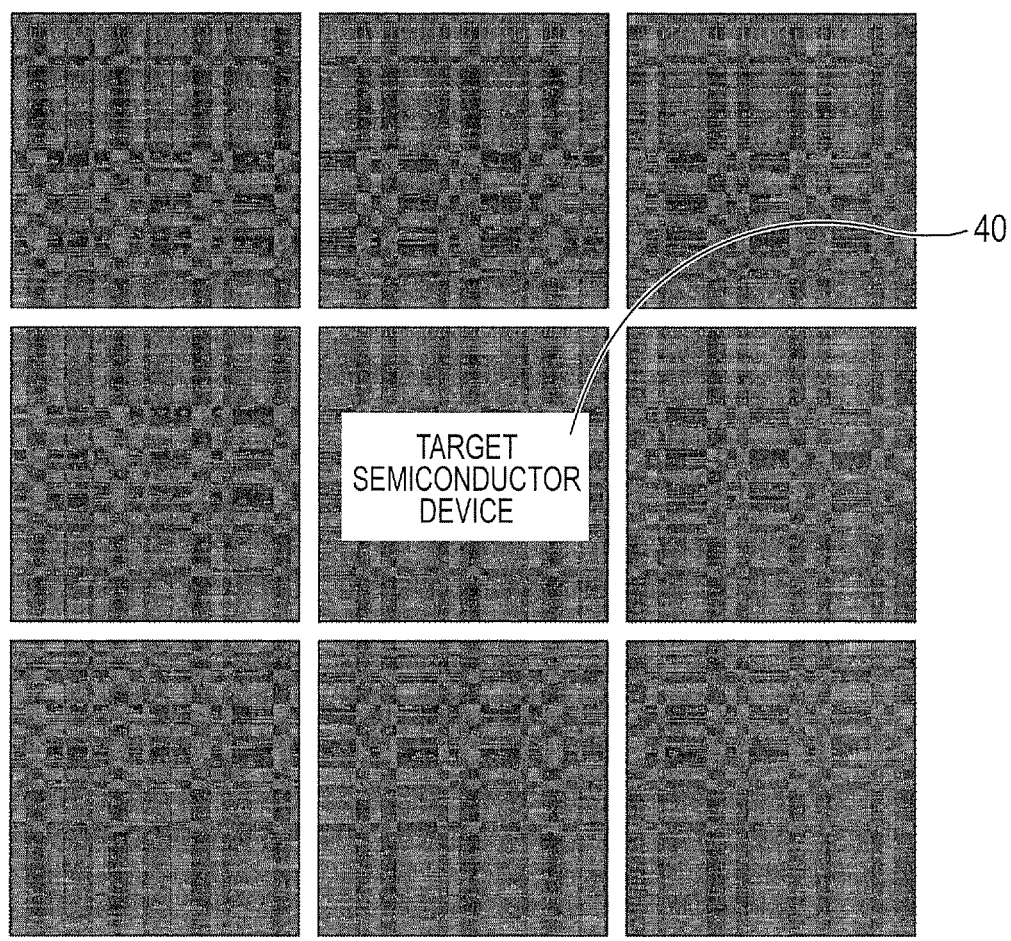
FIG. 8 is a diagram for describing the operation of the screening device according to the second embodiment.
Figure 9:
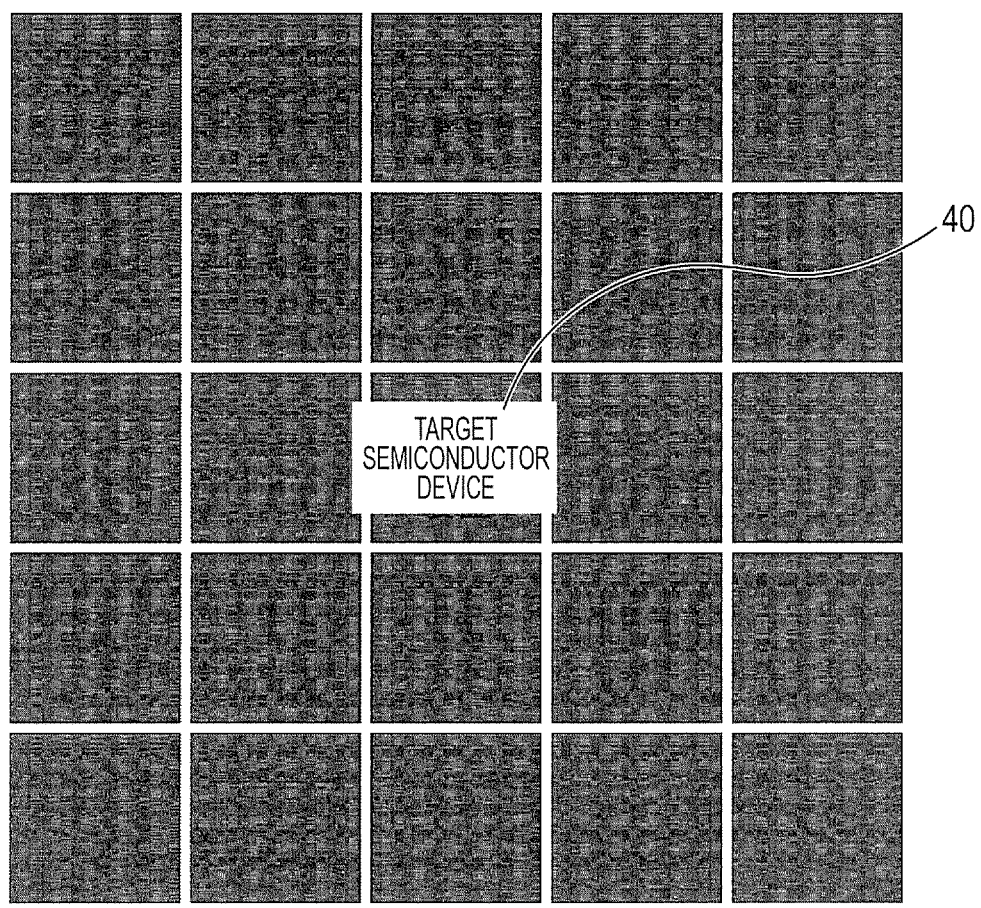
FIG. 9 is a diagram for describing the operation of the screening device according to the second embodiment.
Figure 10:
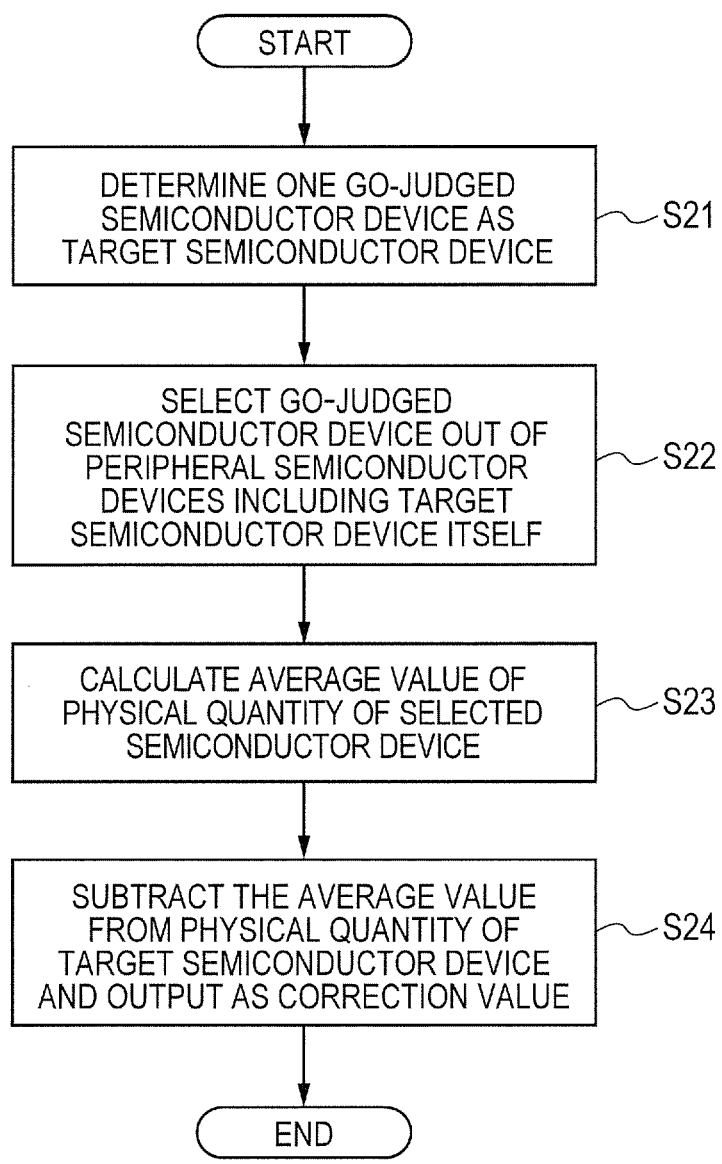
FIG. 10 is a flowchart showing the operation of the screening device according to the second embodiment as one example.

FIGS. 8 and 9 are diagrams for describing the operation of the screening device (computer 25) according to the present embodiment. FIGS. 8 and 9 typically show semiconductor devices fabricated over a wafer. FIG. 10 is a flowchart showing as one example, the operation of the screening device (computer 25) according to the present embodiment.

The operation of the computer 25 shown in FIG. 7 will be explained with reference to FIGS. 8 through 10.

FIG. 8 typically shows the semiconductor devices fabricated over the wafer. In FIG. 8, the central semiconductor device is a target semiconductor device 40. The same type of semiconductor devices as the semiconductor device 40 are fabricated around the semiconductor device 40.

Any of GO-judged semiconductor devices is first assumed to be the target semiconductor device 40 (Step S21).

Next, a GO-judged semiconductor device is selected out of peripheral semiconductor devices (nine semiconductor devices in the typical diagram of FIG. 8) including the target semiconductor device 40 (Step S22).

Next, the average value of a physical quantity of the selected semiconductor device is determined (Step S23).

A value obtained by subtracting the determined average value from the physical quantity of the target semiconductor device 40 is outputted along with position information as a corrected physical quantity (Step S24).

At Step S22, as one example, the nine semiconductor devices including the target itself have been assumed to be the peripheral semiconductor devices. As shown in FIG. 9, twenty five semiconductor devices including a target itself may be assumed to be peripheral semiconductor devices. Semiconductor devices that exist within a preset distance as viewed from the target semiconductor device 40 may be taken as peripheral semiconductor devices.

The screening device according to the present embodiment eliminates components gently varying according to the position of each semiconductor device placed over the wafer, of the characteristics of each semiconductor device by subtracting the average value of the characteristics of the peripheral semiconductor devices from the characteristics of each semiconductor device as described above. Thus, according to the screening device of the present embodiment, defective products of semiconductor devices can be detected with high accuracy even where the characteristics of each semiconductor device vary according to the position thereof placed over the wafer.

Third Embodiment

A screening device according to a third embodiment will be explained with reference to the accompanying drawings.

Figure 11:
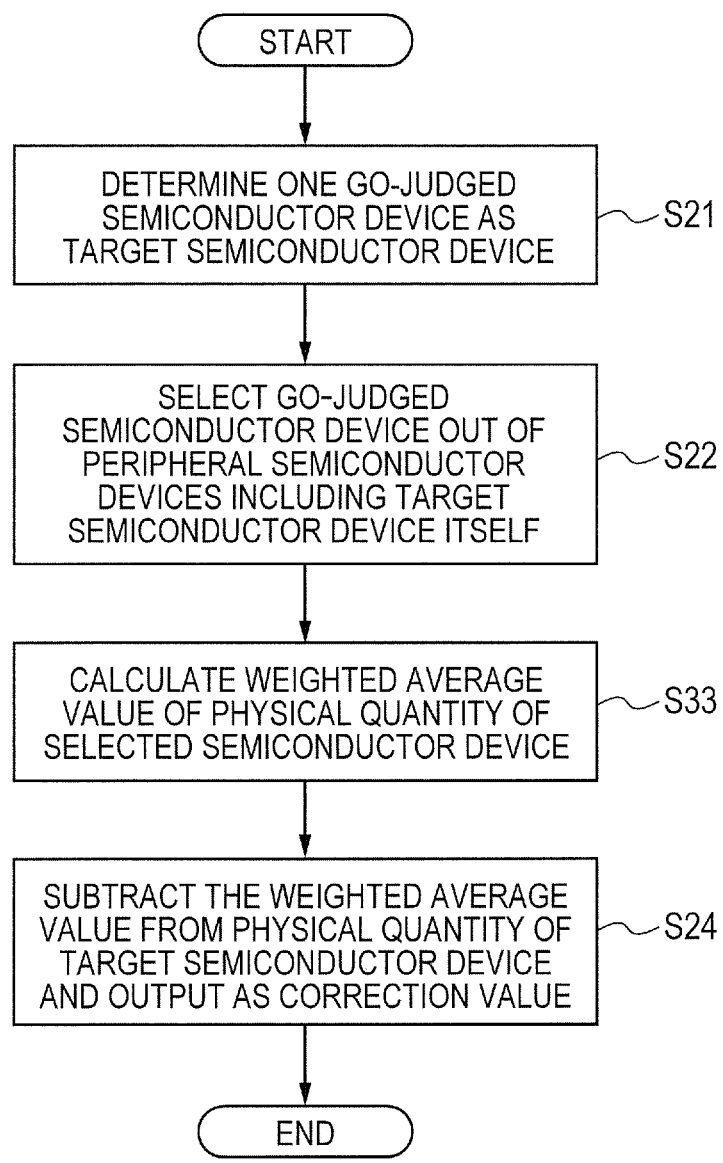
FIG. 11 is a flowchart showing the operation of a third embodiment.
Figure 12:
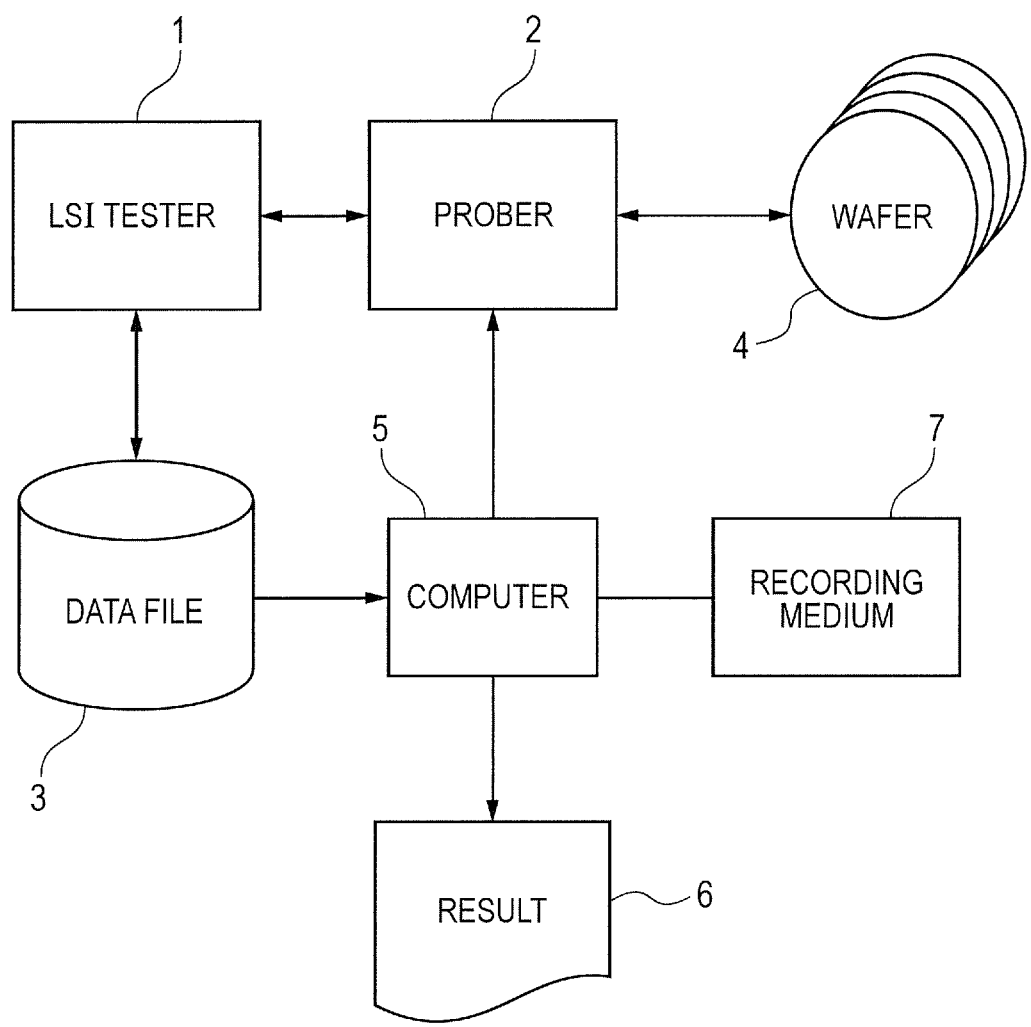
FIG. 12 is a block diagram illustrating the configuration of the screening device described in the Patent Document 1.

FIG. 11 is a flowchart showing as one example, the operation of the screening device according to the present embodiment. In the present embodiment, Step S33 is included instead of Step S23 in the operation (FIG. 10) of the screening device according to the second embodiment.

In the present embodiment, as the average value of physical quantities relative to a target semiconductor device, a weighted average based on weighting corresponding to the distance to the target semiconductor device is used instead of the simple average at Step S23 in the second embodiment. For example, a larger weight is assigned to the physical quantities of semiconductor devices lying closer to a target semiconductor device to calculate a weighted average (Step S33).

A value obtained by subtracting the calculated weighted average from the physical quantity of the target semiconductor device 40 is determined and outputted as a corrected physical quantity (Step S24).

The screening device according to the present embodiment eliminates components gently varying according to the position of each semiconductor device placed over the wafer, of the characteristics of each semiconductor device by subtracting the weighted average value of the characteristics of the peripheral semiconductor devices from the characteristics of each semiconductor device as described above. Thus, according to the screening device of the present embodiment, defective products of semiconductor devices can be detected with high accuracy even where the characteristics of the semiconductor device vary according to the position thereof placed over the wafer.

According to the screening devices according to the first through third embodiments, a variation in the physical quantity indicative of the characteristics of the semiconductor device due to the presence of a defective factor inherent in each semiconductor device can be detected with high accuracy. Each semiconductor device having a defective factor can be screened with high accuracy.

The reasons therefor are as follows: A physical quantity indicative of the characteristics of each semiconductor device is comprised of a component that depends on the position of the semiconductor device over a wafer and a component that does not depend on the position thereof. A variation in the physical quantity due to a defective factor is included in the position-nondependent component. When the physical quantity is assumed to be a function based on the position of the semiconductor device, the physical quantity component dependent on the position is equivalent to a low frequency component in terms of a spatial frequency. Thus, if a low frequency part is cut as a spatial frequency by the two-dimensional filter unit 20 or the average value generator 24, only position-nondependent variable component of physical quantity can be extracted. A distribution of position-nondependent physical quantities is brought to a sufficiently narrow width as compared with the original distribution of physical quantities. A variation in the physical quantity due to the inhering of a defective factor can easily be detected.

Incidentally, the respective disclosures of the related art documents such as the above Patent Documents are intended to be included within the present specification by citation. Embodiments can be changed and modified based on the basic technical ideas of the disclosures within the framework of all disclosures (including claims) of the present invention. Different combinations of various disclosed elements through different selections thereof can be made within the framework of claims of the present invention. That is, it is needless to say that the present invention includes all the disclosures including claims, and various changes and modifications at which a person skilled in the art would have been able to arrive in accordance with the technical ideas.

What is claimed is:

1. A screening method comprising the steps of:
    measuring respective electrical characteristic values of a plurality of semiconductor devices included in a wafer;
    acquiring respective positional information of the semiconductor devices over the wafer;
    subtracting components of variations in the electrical characteristic values depending on an on-wafer position of the semiconductor devices from respective electrical characteristic values of the semiconductor devices not depending on the on-wafer position of the semiconductor devices to thereby correct the respective electrical characteristic values of the semiconductor devices;
    generating distributions of the post-correction electrical characteristic values with respect to the semiconductor devices; and
    detecting semiconductor devices in which the post-correction electrical characteristic values assume outliers, out of the semiconductor devices, based on the distributions.

2. The screening method according to claim 1, wherein in the correcting step, components low in spatial frequency are removed by filtering with respect to two directions orthogonal to each other over the wafer surface.

3. The screening method according to claim 1, wherein in the correcting step, a plurality of peripheral semiconductor devices lying around each of target semiconductor devices are selected, an average value of electrical characteristic values of the selected peripheral semiconductor devices is calculated, and the average value is subtracted from the electrical characteristic values of each of the target semiconductor devices.

4. The screening method according to claim 1, wherein in the correcting step, a plurality of peripheral semiconductor devices lying around each of target semiconductor devices are selected, a weighted average value of electrical characteristic values of the selected peripheral semiconductor devices is calculated while assigning larger weights to semiconductor devices peripheral closer to each of the target semiconductor devices, and the weighted average value is subtracted from the electrical characteristic values of each of the target semiconductor devices.

5. The screening method according to claim 3, wherein in the correcting step, the peripheral semiconductor devices lying within a predetermined distance from each of the target semiconductor devices are selected as a plurality of semiconductor devices lying around each of the semiconductor devices.

6. The screening method according to claim 3, wherein in the correcting step, semiconductor devices included in a rectangular region centering on each of the target semiconductor devices are selected as a plurality of peripheral semiconductor devices lying around each of the target semiconductor devices.

7. The screening method according to claim 1, further including, before the correcting step, a step of removing semiconductor devices in which the electrical characteristic values measured in the measuring step do not fall within a predetermined standard value, from the semiconductor devices.

8. The screening method according to claim 1,
    wherein in the measuring step, respective electrical characteristic values of a plurality of semiconductor devices respectively included in a plurality of wafers included in a single lot are measured, and
    wherein in the generating step, distributions of the post-correction electrical characteristic values are generated with respect to the semiconductor devices included in the wafers.

9. A screening device comprising: a corrector which inputs therein respective electrical characteristic values of a plurality of semiconductor devices included in a wafer and respective positional information of the semiconductor devices over the wafer, and subtracts components of variations in the electrical characteristic values depending on an on-wafer position of the semiconductor devices from the respective electrical characteristic values of the semiconductor devices not depending on the on-wafer position of the semiconductor devices to thereby correct the respective electrical characteristic values of the semiconductor devices;
    a distribution generator which generates distributions of the post-correction electrical characteristic values with respect to the semiconductor devices; and
    an outlier detector which detects semiconductor devices in which the post-correction electrical characteristic values assume outliers, out of the semiconductor devices, based on the distributions.

10. The screening device according to claim 9, wherein the corrector eliminates components low in spatial frequency by filtering with respect to two directions orthogonal to each other over the wafer surface.

11. The screening device according to claim 9, wherein the corrector selects a plurality of peripheral semiconductor devices lying around each of target semiconductor devices, calculates an average value of electrical characteristic values of the selected peripheral semiconductor devices, and subtracts the average value from the electrical characteristic values of each of the target semiconductor devices.

12. The screening device according to claim 9, wherein the corrector selects a plurality of peripheral semiconductor devices lying around each of target semiconductor devices, calculates a weighted average value of electrical characteristic values of the selected peripheral semiconductor devices while assigning larger weights to semiconductor devices closer to each of the target semiconductor devices, and subtracts a weighted average value from the electrical characteristic values of each of the target semiconductor devices.

13. A program which causes a computer to execute:
    a process for acquiring respective electrical characteristic values of a plurality of semiconductor devices included in a wafer and respective positional information of the semiconductor devices over the wafer;
    a process for subtracting components of variations in the electrical characteristic values depending on an on-wafer position of the semiconductor devices from respective electrical characteristic values of the semiconductor devices not depending on the on-wafer position of the semiconductor devices to thereby correct the respective electrical characteristic values of the semiconductor devices;

a process for generating distributions of the post-correction electrical characteristic values with respect to the semiconductor devices; and a process for detecting semiconductor devices in which the post-correction electrical characteristic values assume outliers, out of the semiconductor devices, based on the distributions.

\* \* \* \* \*

UNITED STATES PATENT AND TRADEMARK OFFICE
CERTIFICATE OF CORRECTION

PATENT NO. : 8,878,561 B2
APPLICATION NO. : 13/558980
DATED : November 4, 2014
INVENTOR(S) : Kazuhiro Sakaguchi Page 1 of 1

It is certified that error appears in the above-identified patent and that said Letters Patent is hereby corrected as shown below:

On the Title page

"(30)    Foreign Application Priority Data

Feb. 1, 2001    (JP) ...................... 2011-190262"

should be replaced with

--(30)    Foreign Application Priority Data

Sep. 1, 2011    (JP) ...................... 2011-190262--.

Signed and Sealed this
Second Day of August, 2016

Michelle K. Lee
*Director of the United States Patent and Trademark Office*